(12) United States Patent
Soga

(10) Patent No.: US 10,020,797 B2
(45) Date of Patent: Jul. 10, 2018

(54) PHASE SHIFTER, SEMICONDUCTOR INTEGRATED CIRCUIT, AND PHASED ARRAY SYSTEM

(71) Applicant: FUJITSU LIMITED, Kawasaki-shi, Kanagawa (JP)

(72) Inventor: Ikuo Soga, Isehara (JP)

(73) Assignee: FUJITSU LIMITED, Kawasaki-Shi (JP)

( * ) Notice: Subject to any disclaimer, the term of this patent is extended or adjusted under 35 U.S.C. 154(b) by 0 days.

(21) Appl. No.: 15/677,486

(22) Filed: Aug. 15, 2017

(65) Prior Publication Data

US 2018/0109244 A1   Apr. 19, 2018

(30) Foreign Application Priority Data

Oct. 19, 2016 (JP) ................. 2016-205336

(51) Int. Cl.

| | |
|---|---|
| *H03H 11/20* | (2006.01) |
| *H01P 1/18* | (2006.01) |
| *H01L 27/02* | (2006.01) |
| *H03H 7/20* | (2006.01) |
| *H01Q 3/28* | (2006.01) |
| *H03F 3/193* | (2006.01) |

(Continued)

(52) U.S. Cl.
CPC ......... *H03H 11/20* (2013.01); *H01L 27/0251* (2013.01); *H01P 1/18* (2013.01); *H01Q 3/28* (2013.01); *H01Q 3/38* (2013.01); *H03F 3/005* (2013.01); *H03F 3/193* (2013.01); *H03H 7/20* (2013.01)

(58) Field of Classification Search
CPC combination set(s) only.
See application file for complete search history.

(56) References Cited

U.S. PATENT DOCUMENTS

| 4,210,882 A | 6/1980 | Roza et al. | |
|---|---|---|---|
| 4,587,495 A | * 5/1986 | Osawa | .................... H03F 1/226 330/296 |

(Continued)

FOREIGN PATENT DOCUMENTS

| JP | 61-25255 | 6/1986 |
|---|---|---|
| JP | 8-213878 | 8/1996 |

(Continued)

*Primary Examiner* — An Luu
(74) *Attorney, Agent, or Firm* — Staas & Halsey LLP

(57) ABSTRACT

A phase shifter includes a first variable amplifier circuit configured to receive and amplify a first signal having a first phase; and a second variable amplifier circuit configured to receive and amplify a second signal having a second phase different from the first phase. The phase shifter is configured to generate an output signal having a desired phase by phase combination of an output of the first variable amplifier circuit and an output of the second variable amplifier circuit, and the first variable amplifier circuit and the second variable amplifier circuit each includes a plurality of amplifier circuit units. The amplifier circuit unit includes a first transistor with a grounded gate and a second transistor with a grounded source, and gains of the first variable amplifier circuit and the second variable amplifier circuit are specified according to the number of amplifier circuit units to be activated.

12 Claims, 13 Drawing Sheets

(51) Int. Cl.
*H01Q 3/38* (2006.01)
*H03F 3/00* (2006.01)

(56) References Cited

U.S. PATENT DOCUMENTS

| | | | | |
|---|---|---|---|---|
| 7,570,119 B2* | 8/2009 | Hamaguchi | ........... | H03F 1/0205 330/310 |
| 8,380,771 B2* | 2/2013 | Hahn | ................ | H03H 11/1291 708/300 |
| 8,422,974 B2* | 4/2013 | Hahn | .................... | H04B 1/126 375/146 |
| 2001/0017556 A1 | 8/2001 | Tokumitsu et al. | | |

FOREIGN PATENT DOCUMENTS

| JP | 8-213879 | 8/1996 |
|---|---|---|
| JP | 2001-244746 | 9/2001 |

* cited by examiner

| PHASE(°) | THE NUMBER OF AMPLIFIER CIRCUIT UNITS(31) OF AN ACTIVE STATE IN A FIRST VARIABLE AMPLIFIER CIRCUIT(3i) | THE NUMBER OF AMPLIFIER CIRCUIT UNITS(31) OF AN ACTIVE STATE IN A SECOND VARIABLE AMPLIFIER CIRCUIT(3q) |
|---|---|---|
| 0 | 100 | 0 |
| 15 | 75 | 20 |
| 30 | 67 | 39 |
| 45 | 55 | 55 |
| 60 | 39 | 67 |
| 75 | 20 | 75 |
| 90 | 0 | 100 | ns

PHASE SHIFTER, SEMICONDUCTOR INTEGRATED CIRCUIT, AND PHASED ARRAY SYSTEM

CROSS-REFERENCE TO RELATED APPLICATION

This application is based upon and claims the benefit of priority of the prior Japanese Patent Application No. 2016-205336, filed on Oct. 19, 2016, the entire contents of which are incorporated herein by reference.

FIELD

The embodiments described herein are related to a phase shifter, a semiconductor integrated circuit, and a phased array system

BACKGROUND

In recent years, for example, beam forming or beam steering has been used as phased array systems for millimeter wave bands. Such phased array systems are used for, for example, communications between a base station and a terminal or a vehicle-mounted radar in fifth-generation mobile communication systems (5G: 5th Generation).

Such phased array systems include a phase shifter. A signal having a desired phase (an intermediate phase of two signals) is generated by controlling the gains of two amplifiers in combination, the amplifiers amplifying two signals having a phase difference of 90°.

As described above, a phase shifter applied to a phased array system generates a desired phase signal by controlling the gains of amplifiers that amplify different phase signals. However, amplifiers for amplifying, for example, millimeter wave signals may vary in phase according to an amplification factor due to parasitic capacitances. This may increase the phase error of an output signal from the phase shifter.

Thus, when the output signal of a phase shifter has a large phase error, it is difficult to implement a phased array system (beam forming or beam steering) used for millimeter wave communications or radar.

Incidentally, various phase shifters applied to phased array systems have been proposed in the past.

Patent Document 1: Japanese Laid-open Patent Publication No. H08(1996)-213878
Patent Document 2: Japanese Laid-open Patent Publication No. H08(1996)-213879
Patent Document 3: Japanese Laid-open Patent Publication No. 2001-244746
Patent Document 4: Japanese Examined Patent Application Publication No. S61(1986)-025255

SUMMARY

According to an aspect of the embodiments, there is provided a phase shifter including a first variable amplifier circuit configured to receive and amplify a first signal having a first phase; and a second variable amplifier circuit configured to receive and amplify a second signal having a second phase different from the first phase.

The phase shifter is configured to generate an output signal having a desired phase by phase combination of an output of the first variable amplifier circuit and an output of the second variable amplifier circuit, and the first variable amplifier circuit and the second variable amplifier circuit each includes a plurality of amplifier circuit units. The amplifier circuit unit includes a first transistor with a grounded gate and a second transistor with a grounded source, and gains of the first variable amplifier circuit and the second variable amplifier circuit are specified according to the number of amplifier circuit units to be activated.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First, before describing embodiments of a phase shifter, a semiconductor integrated circuit and a phased array system in detail, an example of a phase shifter, a semiconductor integrated circuit and a phased array system will be explained with reference to FIG. 1A to FIG. 5D.

Figure 1A:
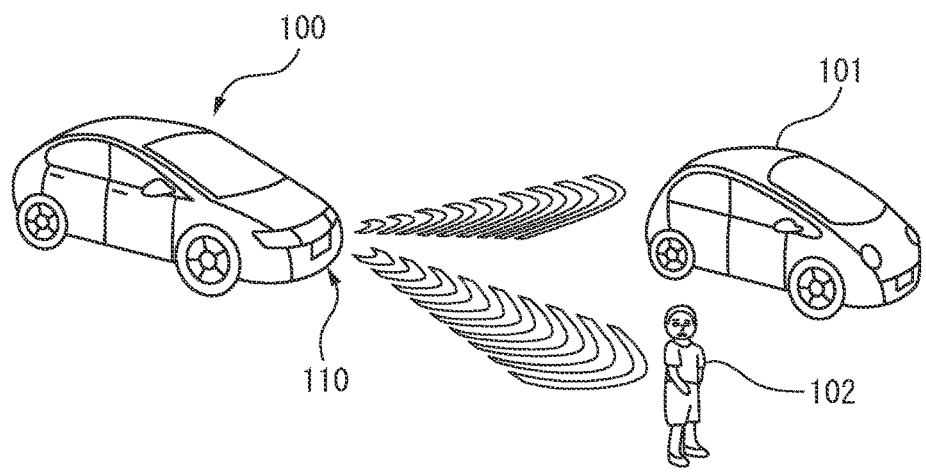
FIG. 1A and FIG. 1B are schematic diagrams of a phased array system.
Figure 1B:
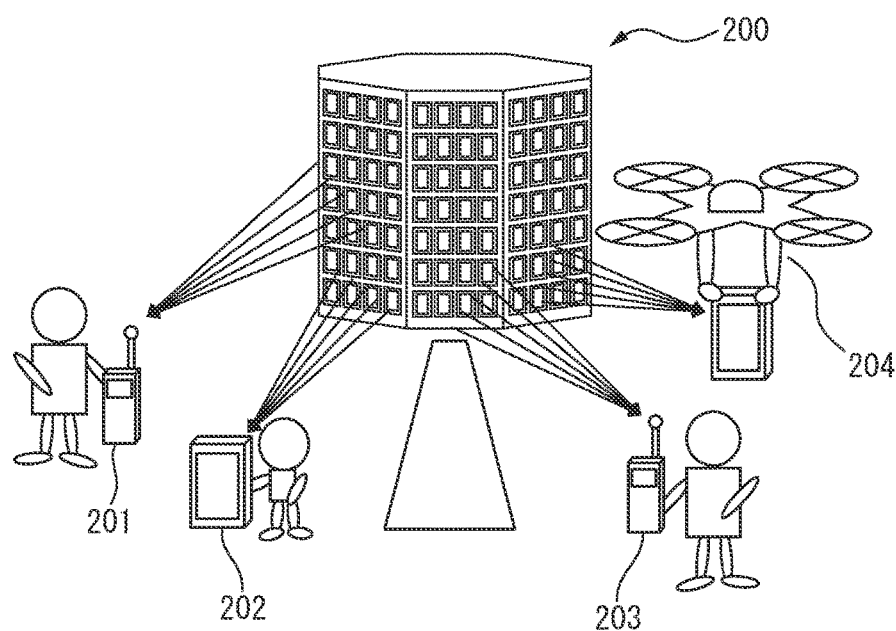

FIG. 1A and FIG. 1B are schematic diagrams of a phased array system. A vehicle-mounted radar and a fifth-generation mobile communication system are schematically illustrated as an example.

As illustrated in FIG. 1A, the phased array system may provide radio waves with directivity or may control the direction of radio waves and thus the phased array system can be applied to, for example, a radar mounted at a front part 110 of an automobile 100. The phased array system detects a preceding vehicle 101 and a pedestrian 102, measures the relative speed or distance thereof, and then controls, for example, the speed and braking of the automobile 100. In other words, the directivity of millimeter waves is dynamically controlled such that the automobile 100 is controlled to instantly avoid an obstacle.

As illustrated in FIG. 1B, the phased array system may be applied to communications between a base station 200 and a cellular phone 201, a tablet 202, a smartphone 203, and a drone 204 having the same functions as a smartphone. In other words, converging radio waves (millimeter waves) are intensively emitted in a specific direction so as to improve radio field intensity.

Figure 2:
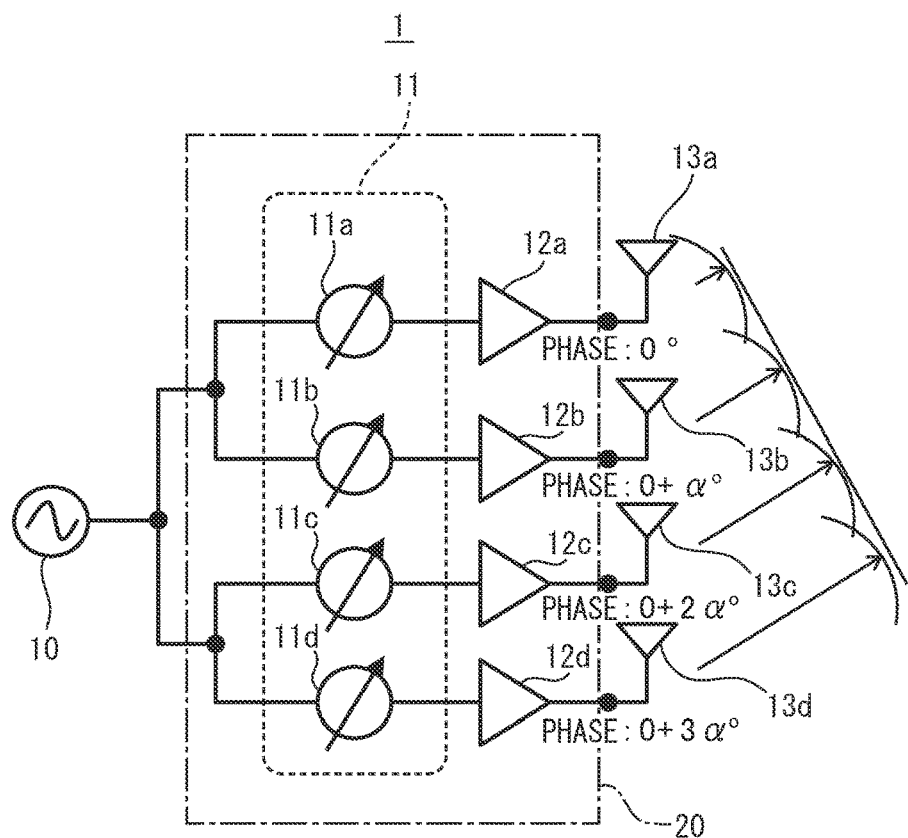
FIG. 2 is a block diagram illustrating an example of a phase shifter (semiconductor integrated circuit) applied to the phased array system depicted in FIG. 1A and FIG. 1B.

FIG. 2 is a block diagram illustrating an example of the phase shifter (semiconductor integrated circuit) applied to the phased array system depicted in FIG. 1A and FIG. 1B. FIG. 2 illustrates a phased array system 1 for implementing the foregoing beam forming or beam steering.

As illustrated in FIG. 2, a phase shifter 11 has four (multiple) variable phase units 11a to 11d. The outputs of the variable phase units 11a to 11d are amplified by amplifiers 12a to 12d, respectively, and then signals (millimeter waves) are the output with phases of 0°, (0+α)°, (0+2α)°, and (0+3α)° through antennas 13a to 13d. In other words, radio waves (millimeter waves) with a phase difference (α°) are emitted from the adjacent antennas 13a to 13d so as to be output in a certain direction. For a vehicle-mounted radar, for example, a phase accuracy of 3° (accuracy allowing recognition at a distance of 200 m with an error of 1 m) is preferable.

Reference numeral 10 denotes an oscillator that outputs oscillation signals with a phase difference of 90° (phase quadrature) to the respective variable phase units 11a to 11d. For example, the oscillator 10 outputs 0° and 90° phase signals to the variable phase unit 11a and outputs 90° and 180° phase signals to the variable phase unit 11b. Moreover, the oscillator 10 outputs 180° and 270° phase signals to the variable phase unit 11c and outputs 270° and 360° (0°) phase signals to the variable phase unit 11d.

Reference numeral 20 denotes a semiconductor integrated circuit. The semiconductor integrated circuit 20 includes the phase shifter 11 (variable phase units 11a to 11d) and the amplifiers 12a to 12d. Needless to say, the number of variable phase units 11a to 11d is not limited to four and a phase difference between the signals output from the oscillator 10 can be changed in accordance with the number of variable phase units.

Figure 3:
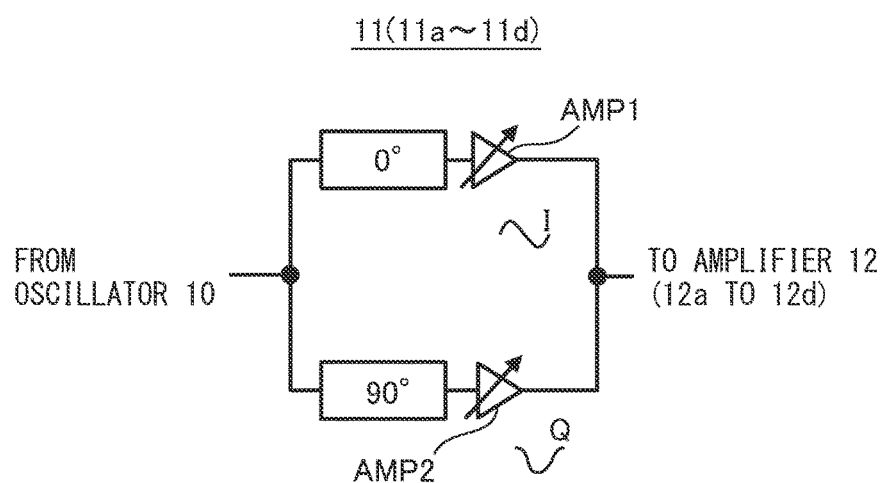
FIG. 3 is a block diagram illustrating the principal part of the phase shifter depicted in FIG. 2.

FIG. 3 is a block diagram illustrating the principal part (the variable phase units 11a to 11d) of the phase shifter depicted in FIG. 2. As described above, for example, the variable phase unit 11a includes variable base amplifier circuits AMP1 and AMP2 that receive a 0° phase signal I and a 90° phase signal Q output from the oscillator 10 and amplify the signals. The gains of the variable amplifier circuits AMP1 and AMP2 are variably controlled.

Figure 4A:
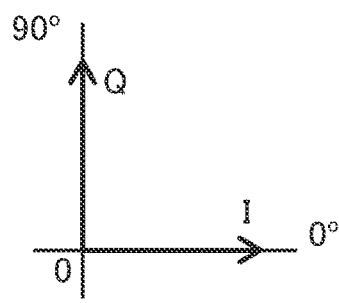
FIG. 4A, FIG. 4B and 4C FIG. are explanatory drawings of the operation of the phase shifter illustrated in FIG. 3.
Figure 4B:
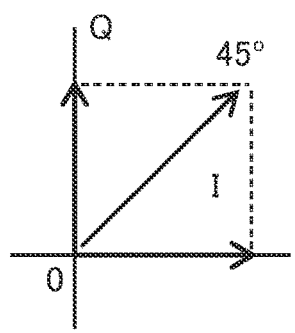
Figure 4C:
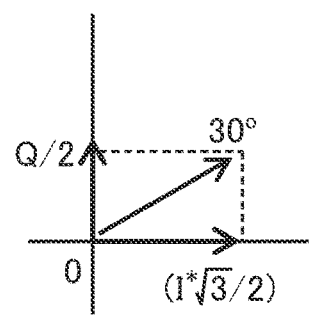

FIG. 4A, FIG. 4B and FIG. 4C are explanatory drawings of the operation of the phase shifter illustrated in FIG. 3, i.e., the operation of the variable phase unit 11a that receives the (0° and 90°) signals I and Q in phase quadrature. In FIG. 4A, 0° and 90° phase signals are output. In FIG. 4B, a 45° phase signal is output. In FIG. 4C, a 30° phase signal is output.

As illustrated in FIG. 4A, when the 0° phase signal is output, the variable amplifier circuit AMP1 that receives and amplifies the 0° phase signal I has a maximum gain ("1") and the variable amplifier circuit AMP2 that receives and amplifies the 90° phase signal Q has a minimum gain ("0"). When the 90° phase signal is output, the variable amplifier circuit AMP1 that amplifies the 0° phase signal I has the minimum gain ("0") and the variable amplifier circuit AMP2 that amplifies the 90° phase signal Q has the maximum gain ("1").

As illustrated in FIG. 4B, when the 45° phase signal is output, the variable amplifier circuits AMP1 and AMP2 have a gain of "1". As illustrated in FIG. 4C, when the 30° phase signal is output, the variable amplifier circuit AMP1 has a gain of "$3^{1/2}/2$" and the variable amplifier circuit AMP2 has a gain of "½".

In this way, the variable phase unit 11a that receives the 0° and 90° phase signals I and Q controls the gains of AMP1 and AMP2 and vector-synthesizes (combines phases) the gain-controlled outputs (output signals) in phase quadrature. This allows the output of a signal having any phase between 0° and −90°. Similarly, the variable phase units 11a to 11d are allowed to output signals having any phases between 0° and 360°.

Figure 5A:
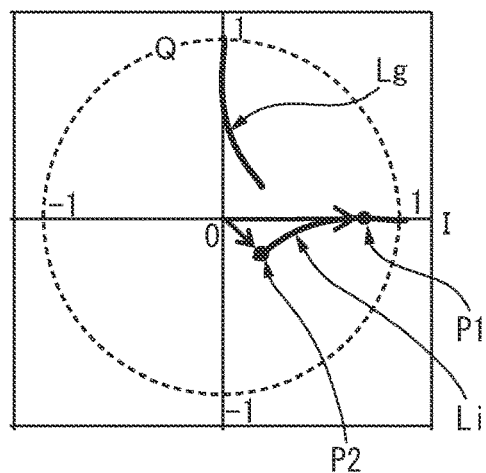
FIG. 5A, FIG. 5B, FIG. 5C and 5D are explanatory drawings of the problems of the phase shifter illustrated in FIG. 3.
Figure 5B:
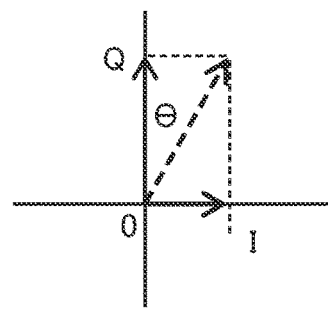
Figure 5C:
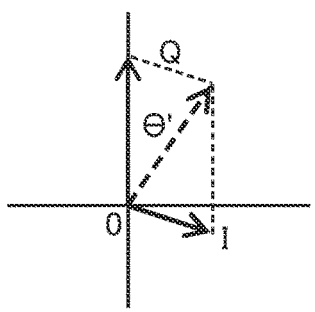

FIG. 5A, FIG. 5B, FIG. 5C and FIG. 5D are explanatory drawings of the problems of the phase shifter illustrated in FIG. 3. FIG. 5A is an explanatory drawing of an actual change of a gain in the variable amplifier circuits AMP1 and AMP2. FIG. 5B illustrates a phase θ of a desired (ideal) output signal. FIG. 5C illustrates a phase θ' of an actual output signal. In FIG. 5A, reference character Li denotes the gain (amplification) characteristics of the actual variable amplifier circuit AMP1 and reference character Lq denotes the gain characteristics of the actual variable amplifier circuit AMP2.

As indicated by the characteristic curve Li of FIG. 5A, when the gain of AMP1 is reduced from "1" to "0" for the 0° phase signal I, the phase of 0° may be maintained at a point (P1) having a large gain, whereas at a point (P2) having a small gain, it is difficult to maintain the phase of 0°. This is caused by, for example, a parasitic capacitance in AMP1 that amplifies the signal I and, as indicated by the characteristic curve Lq, in AMP2 that amplifies the signal Q.

Thus, when the θ-phase output signal in FIG. 5B is generated, the θ'-phase output signal in FIG. 5C is generated. In other words, the phase θ' of the actually generated output signal includes a phase shift caused by the resultant vector of the outputs of AMP1 and AMP2. Thus, for example, a phase error in FIG. 5D occurs between the phase θ of the desired output signal in FIG. 5B and the phase θ' of the actually generated output signal in FIG. 5C.

Figure 5D:
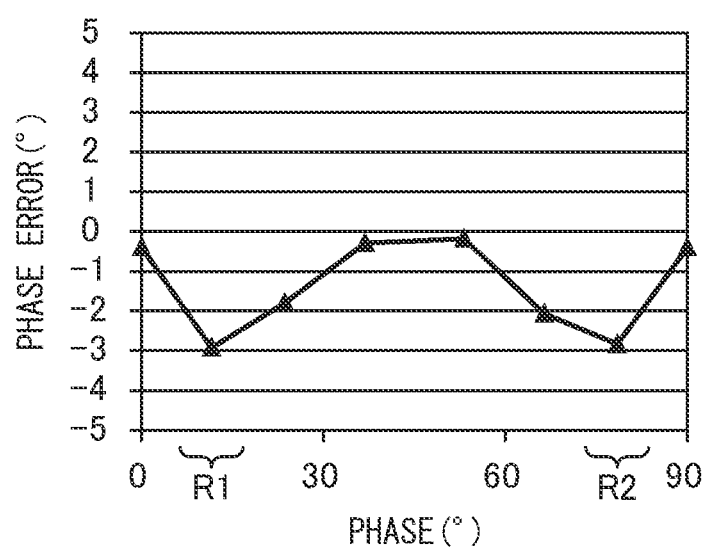

In a region R1 of FIG. 5D, the variable amplifier circuit AMP2 that amplifies the 90° phase signal Q has a relatively small gain, and a large phase shift is caused by the influence of the parasitic capacitance of AMP2. Moreover, in the region R1, the variable amplifier circuit AMP1 that amplifies the 0° phase signal I has a relatively small gain, and a large phase shift is caused by the influence of the parasitic capacitance of AMP1.

As described above, when the gains of signals having different phases are controlled by AMP1 and AMP2 so as to generate output signals having desired phases, the output signal of the phase shifter 11 (11a to 11d) has a large phase error. Thus, in order to reduce such a phase error to achieve accurate phase control, a control voltage needs to be tabulated for each chip, wafer, or lot so as to match a desired phase to an actually generated phase.

However, in order to tabulate the control voltage, a measurement of each chip or wafer is required. Moreover, since the device characteristics are temperature dependent, for example, it is necessary to reread the table in accordance with a temperature change during use. This leads to complication of the processing of the digital unit.

Figure 6A:
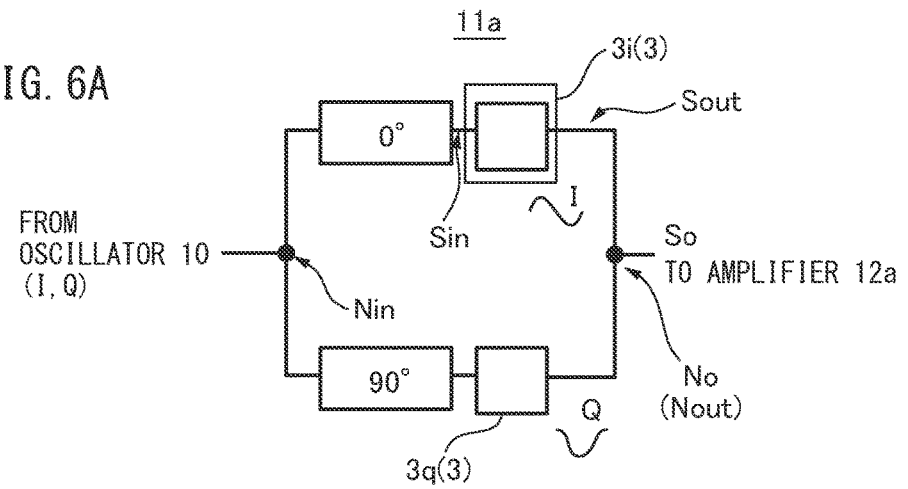
FIG. 6A, FIG. 6B and FIG. 6C are explanatory drawings of the phase shifter according to the present embodiment.
Figure 6B:
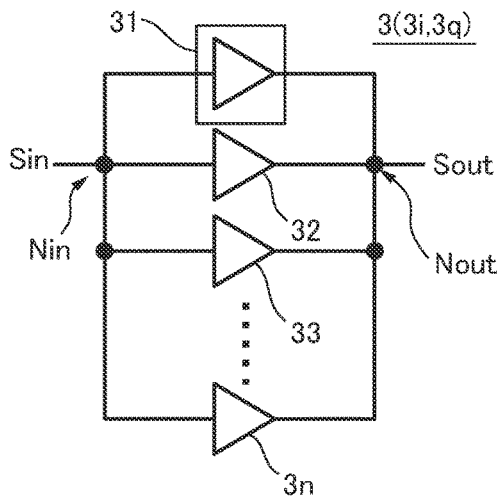
Figure 6C:
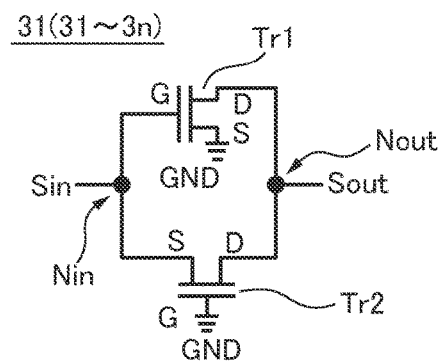

Embodiments of a phase shifter, a semiconductor integrated circuit, and a phased array system will be specifically described below with reference to the accompanying drawings. FIG. 6A, FIG. 6B and FIG. 6C are explanatory drawings of the phase shifter according to the present embodiment. FIG. 6A illustrates a configuration corresponding to the variable phase unit 11a (1, 11a to 11d) in FIG. 2. FIG. 6B illustrates a variable amplifier circuit 3i(3) in FIG. 6A. FIG. 6C illustrates the amplifier circuit unit 31(31 to 3n) in FIG. 6B.

As illustrated in FIG. 6A, for example, in the variable phase unit 11a, a 0° phase signal I is input from an oscillator 10 to the variable amplifier circuit 3i through an input node Nin and a 90° phase signal Q is input from the oscillator 10 to a variable amplifier circuit 3q through Nin. For example, the phase shifter 11 only needs to include at least one variable phase unit 11a. Obviously, the phase of a signal applied to the variable phase unit 11a (phase shifter 11) is not limited to 90° as long as the signals have different phases.

The output of the variable amplifier circuit 3i and the output of the variable amplifier circuit 3q undergo phase combination and are output as an output signal So through a node No (Nout). The output signal So having undergone the phase combination is amplified by an amplifier 12a in the subsequent stage and is then emitted from an antenna 13a as illustrated in, for example, FIG. 2.

The variable amplifier circuit 3i that amplifies the 0° phase signal I has the same configuration as the variable amplifier circuit 3q that amplifies the 90° phase signal Q. In the following explanation, the variable amplifier circuits will be mainly described as the variable amplifier circuit 3. The amplifier circuit units 31 to 3n also have the same configuration, and thus the amplifier circuit units will be mainly described as the amplifier circuit unit 31.

As illustrated in FIG. 6B, the variable amplifier circuit 3 (3i, 3q) includes the multiple amplifier circuit units 31 (31 to 3n). A gain (amplification factor) is specified according to the number of amplifier circuit units 31 to 3n to be activated, and an output signal Sout is generated. As illustrated in FIG. 6C, the amplifier circuit unit 31 (31 to 3n) includes a transistor (first transistor) Tr1 with a grounded (GND) gate G and a transistor (second transistor) Tr2 with a grounded source S. The source S of the first transistor Tr1 and the gate G of the second transistor Tr2 are commonly connected to the input node Nin, whereas the drain D of the first transistor Tr1 and the drain D of the second transistor Tr2 are commonly connected to an output node Nout. The amplifier circuit unit 31 to perform amplification (to be activated) activates one of the first and second transistors Tr1 and Tr2 and deactivates the other transistor. The amplifier circuit unit 31 which does not perform amplification (to be deactivated) activates both of the first and second transistors Tr1 and Tr2. In this way, the amplifier circuit unit 31 to be activated activates one of the two transistors Tr1 and Tr2, the amplifier circuit unit 31 to be deactivated activates both of the transistors, and a gain is controlled according to the number of amplifier circuit units 31 to be activated, thereby reducing the phase error of the output signal.

Moreover, the first transistor Tr1 with the grounded gate G under on-off control tends to affect the impedance characteristics of the circuit. Thus, it is preferable to always activate the first transistor Tr1 while activating or deactivating the second transistor Tr2. In other words, it is preferable that the first transistor Tr1 is always activated, the second transistor Tr2 is activated to stop (deactivate) the amplification of the amplifier circuit unit 31, and the second transistor Tr2 is deactivated to perform (activate) the amplification of the amplifier circuit unit 31.

The second transistors Tr2 under on-off control in the amplifier circuit units 31 may be individually controlled. Alternatively, the second transistors Tr2 may be collectively controlled by, for example, the number of powers (1, 2, 4, 8, 16, . . . ). Specifically, when the eight second transistors Tr2 are deactivated and the eight amplifier circuit units 31 are operated (activated), control voltages for activating the respective eight second transistor Tr2 may be simultaneously applied to the second transistors Tr2.

In FIG. 6C, the first and second transistors Tr1 and Tr2 are n-channel type MOS transistors, but are not limited thereto. In other words, in FIG. 6C, re-channel type MOS transistors are used in consideration of, for example, the millimeter-wave frequencies used and cost, but may be replaced with p-channel type MOS transistors. Furthermore, various transistors of compound semiconductors may instead be used. The phase shifter of the present embodiment is applicable to, for example, the semiconductor integrated circuit 20 described with reference to FIG. 2 or the phased array system 1.

Figure 7A:
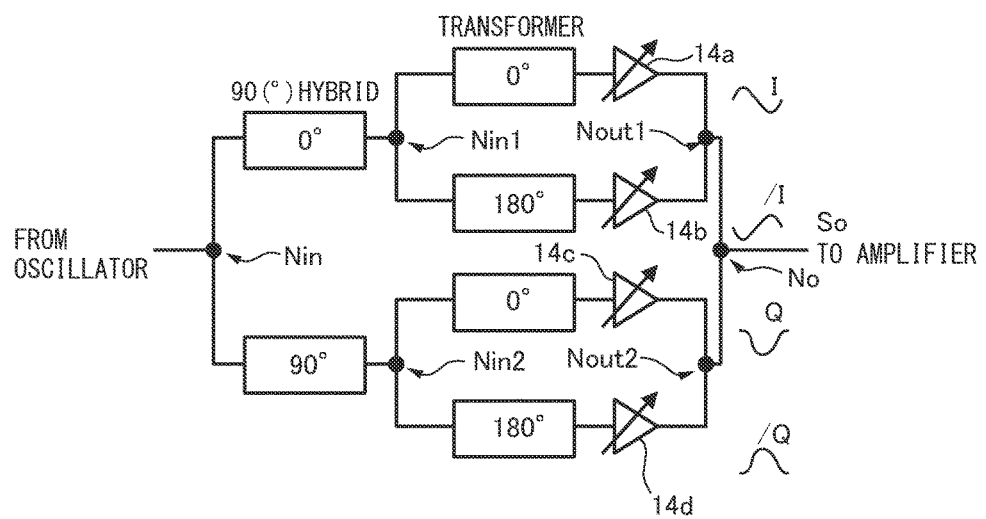
FIG. 7A, FIG. 7B, FIG. 7C and FIG. 7D are explanatory drawings of a modification of the phase shifter according to the present embodiment.

FIG. 7A, FIG. 7B, FIG. 7C and FIG. 7D are explanatory drawings of a modification of the phase shifter according to the present embodiment, i.e., a 90° hybrid phase shifter. As illustrated in FIG. 7A, in the present embodiment, the gains of the 0° phase signal I, an inverted logic signal/I of the signal I, the 90° phase signal Q, and an inverted logic signal/Q of the signal Q may be controlled by variable phase units 14a to 14d, and the outputs of the variable phase units 14a to 14d may undergo phase combination. In FIG. 7A, the node for receiving the output of the oscillator is denoted as Nin and the node for inputting different phase signals to the variable phase units 14a and 14b through a transformer (alternating-current coupling device) is denoted as Nin1. Moreover, the node for inputting different phase signals to the variable phase units 14a and 14b through a transformer is denoted as Nin2 and the node for phase combination of the outputs of the variable phase units 14a to 14d and outputting the output signal So is denoted as No.

Figure 7B:
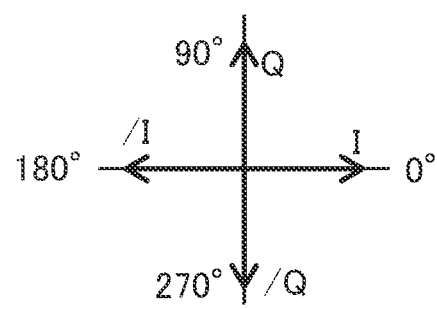
Figure 7C:
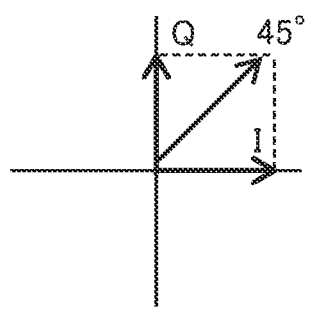
Figure 7D:
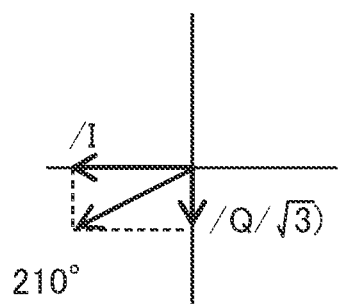

In FIG. 7B, 0°, 90°, 180°, and 270° phase signals are output. In FIG. 7C, a 45° phase signal is output. In FIG. 7D, a 210° phase signal is output. The variable phase units 14a to 14d have the same configurations as those illustrated with reference to FIG. 6A to FIG. 6C. The gains of the phase signals are controlled according to the number of amplifier circuit units 31 to be activated. This allows the generation of the output signal So having any phase between 0° and 360°.

Figure 8:
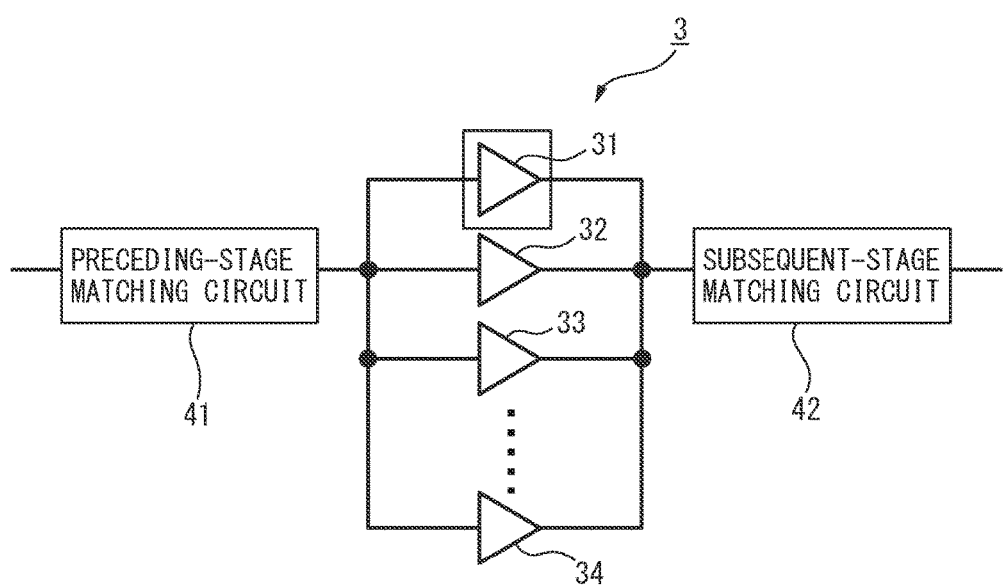
FIG. 8 is a block diagram illustrating a first embodiment of the phase shifter.
Figure 9A:
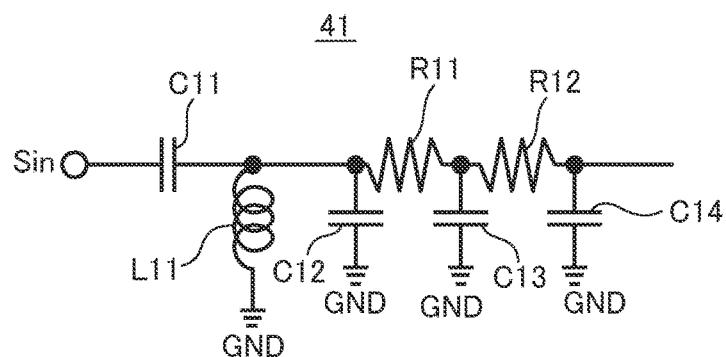
FIG. 9A, FIG. 9B and FIG. 9C are circuit diagrams illustrating an example of the phase shifter according to the first embodiment depicted in FIG. 8.
Figure 9B:
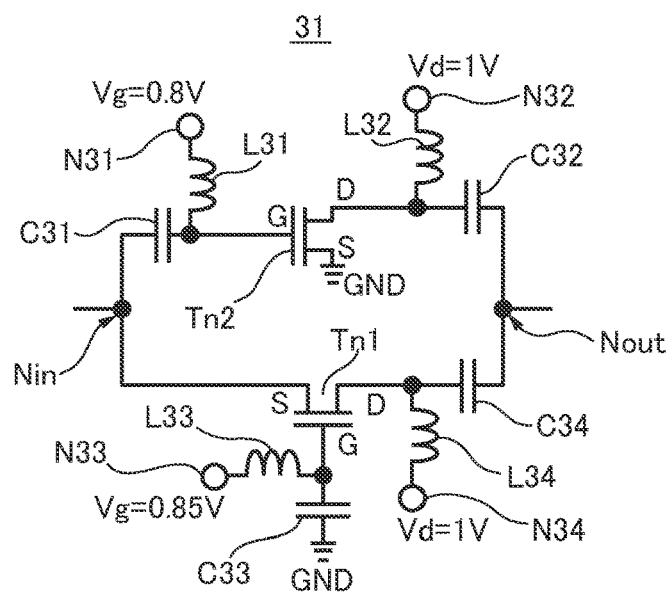
Figure 9C:
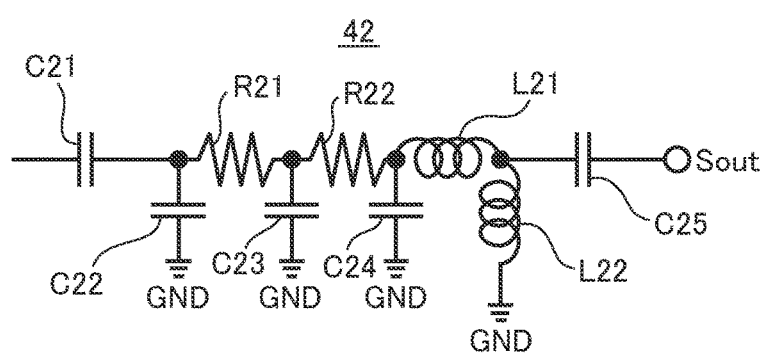

FIG. 8 is a block diagram illustrating a first embodiment of the phase shifter. FIG. 9A, FIG. 9B and FIG. 9C are circuit diagrams illustrating an example of the phase shifter according to the first embodiment depicted in FIG. 8. FIG. 8 corresponds to a configuration where a preceding-stage matching circuit 41 is provided in the preceding stage of a variable amplifier circuit 3 and a subsequent-stage matching circuit 42 is provided in the subsequent stage of the variable amplifier circuit 3. FIG. 9A illustrates an example of the preceding-stage matching circuit 41. FIG. 9B illustrates the principal part (an example of an amplifier circuit unit 31) of the phase shifter according to the first embodiment. FIG. 9C illustrates an example of the subsequent-stage matching circuit 42.

As illustrated in FIG. 9A, the preceding-stage matching circuit 41 includes capacitors C11 to C14, an inductor L11, and resistors R11 and R12. As illustrated in FIG. 9C, the subsequent-stage matching circuit 42 includes capacitors C21 to C25, inductors L21 and L22, and resistors R21 and R22. Needless to say, the matching circuits 41 and 42 may be modified and changed in various ways.

As illustrated in FIG. 9B, the amplifier circuit unit 31 includes n-channel type MOS transistors Tn1 and Tn2, capacitors C31 to C34, and inductors L31 to L34. The gate G of the transistor (first transistor) Tn1 is grounded (GND) through the capacitor C33, the source S of the transistor Tn1 is connected to the input node Nin, and the drain D of the transistor Tn1 is connected to the output node Nout through the capacitor C34. The source S of the transistor (second transistor) Tn2 is grounded, the gate G of the transistor Tn2 is connected to the input node Nin through the capacitor C34, and the drain D of the transistor Tn2 is connected to the output node Nout through the capacitor C32.

In FIG. 9B, nodes N31 to N34 denote control voltage application nodes. The node N31 is connected to a connection point between the gate G of the transistor Tn2 and the capacitor C31. The node N31 controls the gate voltage of the second transistor Tn2. Moreover, the node N33 is connected to a connection point between the gate G of the transistor Tn1 and the capacitor C33 via the inductor L33. The node N33 controls the gate voltage of the first transistor Tn1. The node N32 is connected to a connection point between the drain D of the transistor Tn2 and the capacitor C32 via the inductor L32. The node N34 is connected to a connection point between the drain D of the transistor Tn1 and the capacitor C34 via the inductor L34.

When the amplifier circuit unit 31 is deactivated, i.e., the amplifier circuit unit 31 is not caused to perform amplification, the two transistors Tn1 and Tn2 are both operated (activated). Thus, for example, a voltage of "1 V" is applied to the nodes N32 and N34, a voltage of "0.85 V" is applied to the node N33, and a voltage of "0.8 V" is applied to the node N31. In other words, when the n-channel type MOS transistors Tn1 and Tn2 have a drain voltage of "1 V", the transistor Tn1 has a gate voltage of "0.85 V", and the transistor Tn2 has a gate voltage of "0.8 V", the transistors Tn1 and Tn2 are both activated to preclude the acquisition of a gain.

When the amplifier circuit unit 31 is caused to perform amplification (activated), one of the two transistors Tn1 and Tn2 is deactivated. As described above, it is more preferable to deactivate the second transistor Tn2 to perform amplification. For example, the transistor Tn2 is deactivated when the node N31 has a voltage of "0 V", i.e., the second transistor Tn2 has a gate voltage of "0 V".

Thus, the amplifier circuit unit 31 performs amplification with the transistor Tn1 activated and the transistor Tn2 deactivated. The gain (amplification factor) of a phase input signal (I, Q) is controlled according to the number of amplifier circuit units 31 for the amplification. In other words, the gain of the variable amplifier circuit 3 (3$i$, 3$q$) is specified according to the number of amplifier circuit units 31 to be activated. Voltage values applied to the nodes N31 to N34 are merely exemplary and are obviously changeable in various ways.

Figure 10:
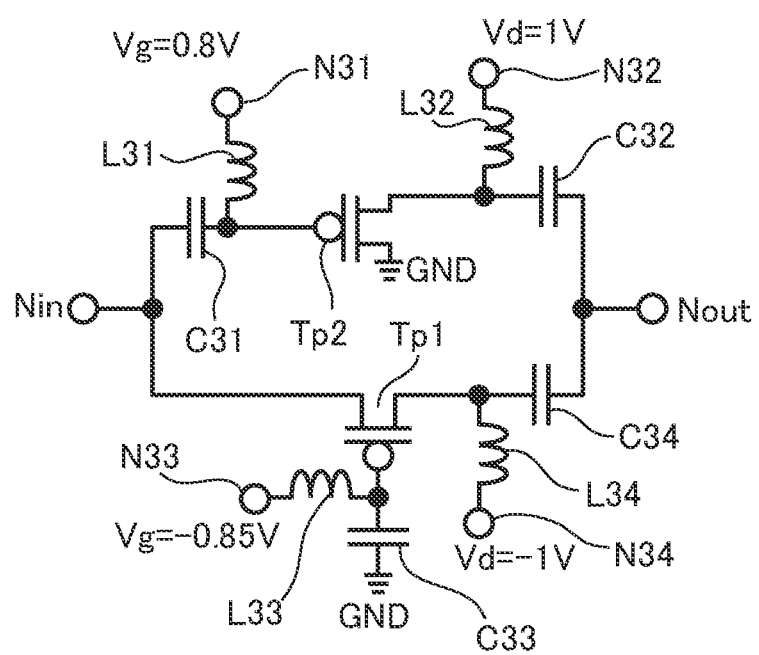
FIG. 10 is a circuit diagram illustrating the principal part of a phase shifter according to a second embodiment.

FIG. 10 is a circuit diagram illustrating the principal part of a phase shifter according to a second embodiment. The n-channel type MOS transistors Tn1 and Tn2 in the amplifier circuit unit 31 illustrated with reference to FIG. 9B are replaced with p-channel type MOS transistors Tp1 and Tp2. Capacitors C31 to C34 and inductors L31 to L34 are connected as in FIG. 9B.

When the phase shifter (amplifier circuit unit 31) according to the second embodiment in FIG. 10 is deactivated, i.e., when the amplification of the amplifier circuit unit 31 is not performed, the two transistors Tp1 and Tp2 are both operated (activated). Thus, for example, a voltage of "−0.8 V" is applied to node N31, a voltage of "−1 V" is applied to node N32, a voltage of "−0.85 V" is applied to node N33, and a voltage of "−1 V" is applied to node N34.

When the amplifier circuit unit 31 is activated (caused to perform amplification), one of the two transistors Tp1 and Tp2 is deactivated. Also in the circuit of FIG. 10, it is more preferable to perform amplification when the second transistor Tp2 is deactivated. In other words, the first transistor Tp1 with a grounded gate G under on-off control tends to affect the impedance characteristics of the circuit. Thus, it is preferable to always activate the first transistor Tp1 while activating or deactivating the second transistor Tp2. Specifically, for example, the node N31 has a voltage of "0 V", i.e., the gate voltage of the second transistor Tp2 is set at "0 V" to deactivate the transistor Tp2, causing the amplifier circuit unit 31 to perform amplification.

Figure 11:
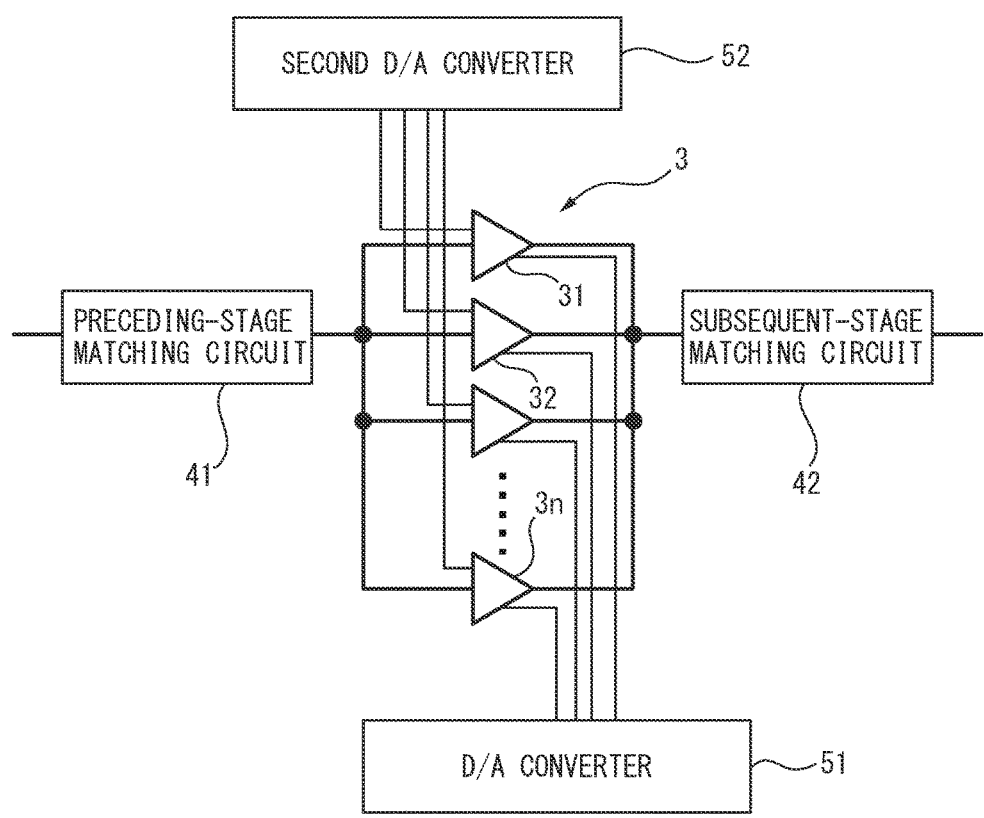
FIG. 11 is a block diagram illustrating an example of the overall configuration of the phase shifter according to the present embodiment.

FIG. 11 is a block diagram illustrating an example of the overall configuration of the phase shifter according to the present embodiment. As is evident from a comparison between FIG. 11 and FIG. 8, the phase shifter in FIG. 11 includes a first D/A converter 51 and a second D/A converter 52. The first D/A converter 51 controls, for example, the gate voltages of the grounded-gate transistors (first transistors Tr1, Tn1, and Tp1) in the amplifier circuit units 31 to 3$n$. The second D/A converter 52 controls the gate voltages of the grounded-source transistors (second transistors Tr2, Tn2, and Tp2) in the amplifier circuit units 31 to 3$n$.

In the amplifier circuit units 31 to 3$n$, when the gate voltage of the grounded-source transistor (second transistor) is controlled to perform on-off control, only the second D/A converter 52 may be provided. However, in the amplifier circuit unit that performs amplification and the amplifier circuit unit that does not perform amplification, when it is preferable to change the gate voltage of the first transistor (Tr1, Tn1, and Tp1) maintained in an active state, the first D/A converter 51 may be also provided.

Figures 12A, 12B:
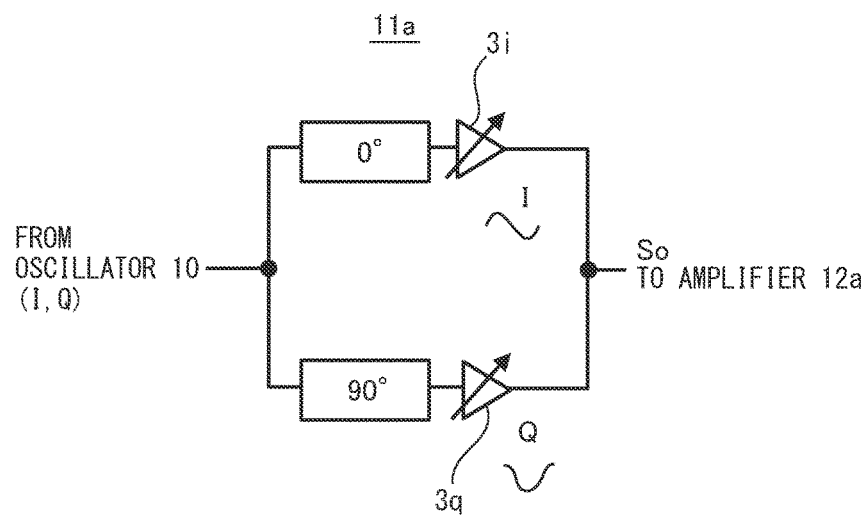
FIG. 12A and FIG. 12B are explanatory drawings of an operation example of the phase shifter according to the present embodiment.

FIG. 12A and FIG. 12B are explanatory drawings of an operation example of the phase shifter according to the present embodiment. FIG. 12A illustrates the configuration of an assumed variable phase unit 11$a$ (phase shifter 11). FIG. 12B indicates the number of amplifier circuit units 31 of an active state in the first and second variable amplifier circuits 3$i$ and 3$q$. FIG. 12A is similar to FIG. 6A. The first and second variable amplifier circuits 3$i$ and 3$q$ each includes the 100 amplifier circuit units (31), the first variable amplifier circuit 3$i$ amplifying a 0° phase signal I, and the second variable amplifier circuit 3$q$ amplifying a 0° phase signal Q.

As illustrated in FIG. 12B when, for example, a 0° phase output signal So is generated, the 100 amplifier circuit units included in the first variable amplifier circuit 3$i$ are all activated, whereas the 100 amplifier circuit units included in the second variable amplifier circuit 3$q$ are all deactivated. When a 90° phase output signal So is generated, the 100 amplifier circuit units included in the first variable amplifier circuit 3$i$ are all deactivated, whereas the 100 amplifier circuit units included in the second variable amplifier circuit 3$q$ are all activated.

Moreover when, for example, a 45° phase output signal So is generated, the 55 amplifier circuit units included in the first variable amplifier circuit 3$i$ and the 55 amplifier circuit units included in the second variable amplifier circuit 3$q$ are activated. Furthermore when, for example, a 30° phase output signal So is generated, the 67 amplifier circuit units included in the first variable amplifier circuit 3$i$ and the 39 amplifier circuit units included in the second variable amplifier circuit 3$q$ are activated. This allows the generation of the output signal So having a desired phase.

In the present embodiment, the first and second transistors are not limited to p-channel or n-channel type MOS transistors. Various transistors of compound semiconductors or the like are also applicable. Moreover, the phase shifter of the present embodiment is applicable to a semiconductor integrated circuit or a phased array system.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A phase shifter comprising:
a first variable amplifier circuit configured to receive and amplify a first signal having a first phase; and
a second variable amplifier circuit configured to receive and amplify a second signal having a second phase different from the first phase, wherein
the phase shifter is configured to generate an output signal having a desired phase by phase combination of an output of the first variable amplifier circuit and an output of the second variable amplifier circuit,
the first variable amplifier circuit and the second variable amplifier circuit each includes a plurality of amplifier circuit units,
the amplifier circuit unit includes a first transistor with a grounded gate and a second transistor with a grounded source, and
gains of the first variable amplifier circuit and the second variable amplifier circuit are specified according to the number of amplifier circuit units to be activated.

2. The phase shifter according to claim 1, wherein a source of the first transistor and a gate of the second transistor are commonly connected to an input node that receives the first signal or the second signal,
a drain of the first transistor and a drain of the second transistor are commonly connected to an output node that outputs the output signal,
the amplifier circuit unit to be activated activates one of the first and second transistors and deactivates the other transistor, and
the amplifier circuit unit to be deactivated activates on both of the first and second transistors.

3. The phase shifter according to claim 2, wherein the amplifier circuit unit to be activated activates the first transistor and deactivates the second transistor.

4. The phase shifter according to claim 2, wherein the first and second transistors are activated or deactivated by controlling gate voltages of the transistors.

5. The phase shifter according to claim 4, wherein the gate of the second transistor is connected to a first control node that receives a signal from the input node and a voltage for on-off control of the second transistor through a first inductor.

6. The phase shifter according to claim 5, wherein the source of the first transistor receives a signal from the input node and the gate of the first transistor is connected to a second control node that is grounded via a first capacitor and receives a voltage for on-off control of the first transistor through a second inductor.

7. The phase shifter according to claim 1, wherein the first and second transistors are MOS transistors.

8. The phase shifter according to claim 7, wherein the first and second transistors are n-channel type MOS transistors.

9. The phase shifter according to claim 1, wherein the first and second signals are millimeter wave signals.

10. The phase shifter according to claim 1, wherein the first phase and the second phase have a phase difference of 90°, and
the phase shifter includes four pairs of the first variable amplifier circuit and the second variable amplifier circuit that receive the first signal and the second signal with a phase difference of 90°.

11. A semiconductor integrated circuit comprising:
a phase shifter; and
an amplifier configured to amplify a signal from the phase shifter, wherein the phase shifter comprises:
a first variable amplifier circuit configured to receive and amplify a first signal having a first phase; and
a second variable amplifier circuit configured to receive and amplify a second signal having a second phase different from the first phase, wherein
the phase shifter is configured to generate an output signal having a desired phase by phase combination of an output of the first variable amplifier circuit and an output of the second variable amplifier circuit,
the first variable amplifier circuit and the second variable amplifier circuit each includes a plurality of amplifier circuit units,
the amplifier circuit unit includes a first transistor with a grounded gate and a second transistor with a grounded source, and
gains of the first variable amplifier circuit and the second variable amplifier circuit are specified according to the number of amplifier circuit units to be activated.

12. A phased array system comprising:
the semiconductor integrated circuit according to claim 11;
an oscillator configured to oscillate the first and second signals input to the phase shifter; and
an antenna configured to emit a signal output from the amplifier.

* * * * *